US006884940B1

(12) United States Patent
Utsumi et al.

(10) Patent No.: US 6,884,940 B1
(45) Date of Patent: Apr. 26, 2005

(54) VACUUM SWITCHGEAR

(75) Inventors: Tomoaki Utsumi, Chiyoda-ku (JP); Kazuhiro Satou, Chiyoda-ku (JP); Takashi Shirone, Chiyoda-ku (JP); Kenji Tsuchiya, Chiyoda-ku (JP); Masato Kobayashi, Chiyoda-ku (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/914,290

(22) Filed: Aug. 10, 2004

(30) Foreign Application Priority Data

Nov. 17, 2003 (JP) ....................................... 2003-386385

(51) Int. Cl.[7] .................................................. H05K 5/00
(52) U.S. Cl. ....................... 174/52.1; 218/118; 218/136
(58) Field of Search ............................... 174/52.1, 52.3, 174/52.4, 35 R; 218/118, 119, 120, 139, 140, 134, 150, 153, 154, 155, 136, 137

(56) References Cited

U.S. PATENT DOCUMENTS 6,144,005 A * 11/2000 Tanimizu et al. ........... 218/118
6,153,846 A * 11/2000 Morita et al. ............... 218/122
6,426,627 B1 * 7/2002 Kikukawa et al. .......... 324/424
6,498,314 B1 * 12/2002 Miyo et al. ................. 218/118

FOREIGN PATENT DOCUMENTS

EP 1381064 A1 * 1/2004 .......... H01H/33/66
JP 2001-176364 6/2001
JP 2001-307603 11/2001
JP 2001-346306 12/2001

OTHER PUBLICATIONS

Patent Abstracts of Japan for JP–2001–346306.
Patent Abstracts of Japan for JP 2001–307603.
Patent Abstracts of Japan for JP 2001–176364.

* cited by examiner

*Primary Examiner*—Dean A. Reichard
*Assistant Examiner*—Carmelo Oliva
(74) *Attorney, Agent, or Firm*—Crowell & Moring LLP

(57) ABSTRACT

A main circuit switching unit and an isolator are accommodated in a vacuum container. A first conductor and a main circuit conductor are arranged to extend in and out of the vacuum container. A movable electrode of the main circuit switching unit is connected to the first conductor through a first flexible conductor, and a movable electrode of the isolator is connected to the main circuit conductor through a second flexible conductor. A shield is arranged around the first conductor and the main circuit conductor. Another shield is arranged around a connecting portion between the first flexible conductor and the movable electrode of the main circuit switching unit. A still another shield is arranged around the isolator. A further another shield is arranged around the second flexible conductor. These shields are secured to the vacuum container through insulating spacers. This arrangement instantly eliminates a dielectric breakdown phenomenon that occurs at electric field concentrated regions by the shields to prevent a dielectric breakdown caused by particulate foreign matters and thereby improve an insulation reliability of the devices.

12 Claims, 2 Drawing Sheets

VACUUM SWITCHGEAR

BACKGROUND OF THE INVENTION

The present invention relates to a vacuum switchgear and more particularly to a vacuum switchgear, in which a switch having a stationary electrode and a movable electrode is enclosed in a vacuum container that requires grounding.

As a conventional vacuum switchgear, for example, there is a construction, in which a vacuum container accommodates a main circuit switching unit for connecting and disconnecting a main circuit conductor to and from a load side conductor or a bus side conductor and a main circuit/earth selecting unit for connecting the main circuit conductor to and from the bus side conductor or the load side conductor and an earthing conductor and in which the vacuum container is formed of a grounded metal or an insulating material with a grounded layer on its surface. This vacuum container accommodates the main circuit conductor and a part of each of the bus side conductor, the earthing conductor and the load side conductor. Further, the vacuum container also has an air terminal unit that respectively connects in air those portions of the bus side conductor, the earthing conductor and the load side conductor projecting from the vacuum container to the bus side, the earth side and the load side. On the outside of the vacuum container, drive mechanisms are installed to operate the main circuit switching unit and the main circuit/earthing selecting unit. This construction is seen in JP-A-2001-346306, page 4–6 and FIG. 4, for instance.

By integrating an interrupting function, a disconnecting function and an earthing function in the single earthed vacuum container, the interruption and insulation performance can be enhanced, allowing the devices to be made compact. During assembly, the vacuum container with the integrated functions serves as one component. There is therefore an advantage that the number of components can be reduced and the reliability improved. Further, by earthing the vacuum container an inspection can be performed online.

In the conventional vacuum switchgear, particulate foreign matters of a few micron meters may be formed by the open-close operation of the switching unit or during the manufacturing process. If these particulates reach a high electric field area in vacuum, a dielectric breakdown may occur even at service voltage. More specifically, an intermediate shield is provided around the main circuit switching unit among the switching units in the vacuum switchgear to shield an arc produced during the open-close operation, and a dielectric breakdown is prevented from being triggered by an arc. However, the other conductors than the main circuit switching unit also provide electric field concentrated regions but are not shielded. If foreign particles enter the electric field concentrated regions, therefore, they can conduct electricity between the conductors in the field concentrated regions and the grounded vacuum container, resulting in a dielectric breakdown. This dielectric breakdown may occur even when the dielectric strength of devices is verified in a withstand voltage test to be several times the service voltage. When this dielectric breakdown is detected as a ground fault by a protective control system in the power system, a circuit breaker may be tripped, resulting in a power system failure. To prevent the dielectric breakdown the field intensity of the electric field concentrated regions has to be reduced, and therefore the sizes of the devices require increasing to lengthen the insulation distances.

SUMMARY OF THE INVENTION

An object of this invention is to prevent a dielectric breakdown due to foreign particulates and improve the insulation reliability of devices.

To achieve the above object, the present invention is contrived that a switching unit having a stationary electrode and a movable electrode is accommodated in a vacuum container required to be earthed, the stationary electrode and the movable electrode are connected to a bus side conductor and a load side conductor or vice versa through wiring conductors in the container, a shield is arranged inside the vacuum container to shield a part or all of an area where particulate foreign matters are produced by open-close operation of the switching unit, and the shield is secured to the vacuum container in a insulated condition therefrom.

In this construction, for instance, when particulate foreign matters reach a high electric field area near the conductors, a dielectric breakdown phenomenon occurs only between the conductors and the shield but not between the shield and the vacuum container. Thus, this dielectric breakdown does not result in a ground fault, nor does it lead to a power system failure. More specifically, in the event that a dielectric breakdown phenomenon is caused by particulate foreign matters, the shield and the conductors are instantly brought to the same potential. However, since the shield is insulated from the vacuum container, an electric field between the conductors and the shield disappears, no longer accelerating charged particles generated by the dielectric breakdown. The dielectric breakdown therefore can no longer persist, and the dielectric strength can recover instantly, preventing damages to the devices. This in turn can prevent a ground fault and also prevent the dielectric breakdown phenomenon from providing a cause for a possible power system failure.

According to the invention it is possible to prevent damages to the devices and a ground fault and to prevent a cause for a possible power system failure.

Other objects, features and advantages of the invention will become apparent from the following description of the embodiments of the invention taken in conjunction with the accompanying drawings.

DETAILED DESCRIPTION OF PREFERRED EMBODIMENTS

An embodiment of the invention will be now described with reference to the accompanying drawings.

Figure 1:
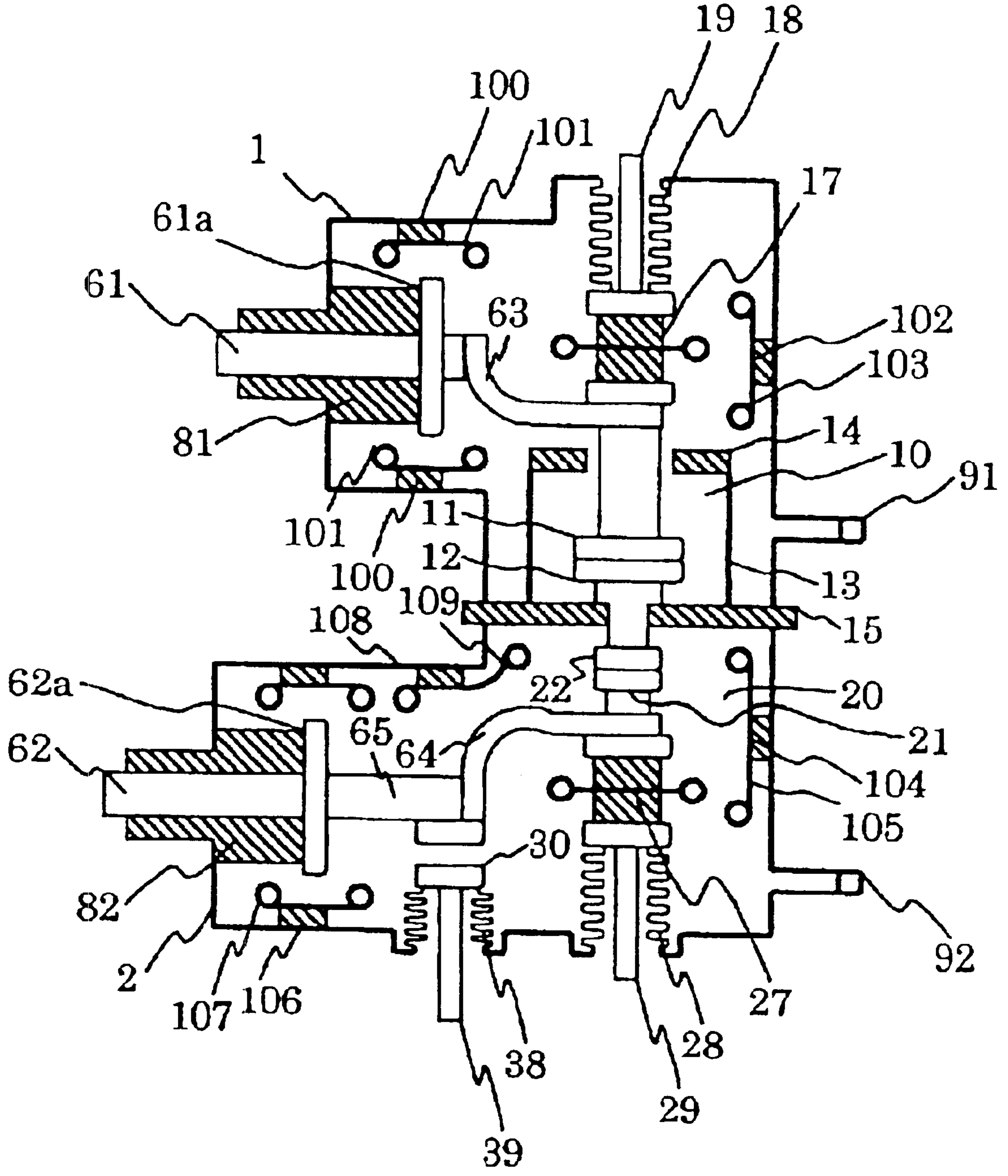
FIG. 1 is a vertical sectional view of a vacuum switchgear showing an embodiment of the invention.

FIG. 1 is a vertical sectional view of a vacuum switchgear showing the embodiment of the invention. In FIG. 1, the vacuum switchgear is represented by one phase of one unit in a power receiving and distribution board comprised of a plurality of units. In this embodiment, a main circuit switching unit 10, an isolator 20, flexible conductors 63, 64, an earthing device 30 and so on are accommodated in vacuum containers 1, 2 that need to be grounded, i.e., in the vacuum containers which are grounded and formed of a metal (stainless steel). A conductor 61 and a main circuit conductor 62 are arranged to extend inside and outside the vacuum containers 1, 2.

The main circuit switching unit 10 has a movable electrode 11 and a stationary electrode 12 and is installed in the vacuum container 1, separated by a spacer 15 from the isolator 20. An intermediate shield 13 is arranged around the movable electrode 11 and the stationary electrode 12 to shield an arc generated when the circuit is opened and closed. The stationary electrode 12 is inserted through a through-hole in a central part of the spacer 15 to be supported by the spacer 15 and is connected to a stationary electrode 22 of the isolator 20. Around the movable electrode 11 is arranged an insulator 14 to prevent charged particulates produced during opening and closing of the movable electrode 11 and the stationary electrode 12 from diffusing outward. The insulator 14 is connected to an end of the intermediate shield 13. The movable electrode 11 is connected to the conductor 61 through the flexible conductor 63 which serves as a wiring conductor in the container. The conductor 61 is inserted into a through-hole in a ceramic connecting portion 81 arranged in and out of the vacuum container 1. The conductor 61 is integrally formed at its end with a disk-shaped portion 61*a* for reducing an electric field concentration. This conductor 61 serves as a bus side conductor when it is connected to a bus disposed outside the vacuum container 1 and as a load side conductor when it is connected to a power line connected to a load.

The movable electrode 11 is connected through an insulating rod 17 to a bellows 18 and an operation rod 19. The movable electrode 11 is thus operated for engagement with or disengagement from the stationary electrode 12 by switching operation of the operation rod 19 coupled to an outside driving mechanism. That is, the main circuit switching unit 10 is adapted to connect or disconnect the conductor 61 and the main circuit conductor 62 by open and close operation of the movable electrode 11 and the stationary electrode 12. The movable electrode 11 and the stationary electrode 12 are formed by mixing a slight amount of such substances as chromium and cobalt to copper to improve an arc resistance and thereby have an excellent current interrupting capability. The flexible conductor 63 is made by laminating a plurality of thin copper plates.

The isolator 20 is received in the vacuum container 2 as an auxiliary switch with a stationary electrode 22 and a movable electrode 21 and is so constructed as to connect or disconnect the main circuit conductor 62 and the main circuit switching unit 10. The movable electrode 21 is connected to the main circuit conductor 62 through the flexible conductor 64 serving as a wiring conductor in the container. The main circuit conductor 62 is inserted into a through-hole in a ceramic connecting portion 82 arranged in and out of the vacuum container 2 and is integrally formed at its almost central part with a disk-shaped portion 62*a* for reducing an electric field intensity. The main circuit conductor 62 serves as a bus side conductor when it is connected to the bus situated outside the vacuum container 2 and as a load side conductor when it is connected to the power line connected with the load. The movable electrode 21 is connected through an insulating rod 27 to a bellows 28 and an operation rod 29. The isolator 20 is opened or closed as the operation rod 29 is operated by an outside driving mechanism. An end of the flexible conductor 64 and an end of the main circuit conductor 62 are each connected to an earthing device 30 having a bellows 38 and an earthing conductor 39. The earthing conductor 39 is opened and closed by an outside driving mechanism. The main circuit conductor 62 is earthed through the earthing conductor 39. The flexible conductor 64 is made by laminating a plurality of thin copper plates.

Ceramic materials used for the connecting portions 81, 82 include alumina, silica, magnesium oxide, titanium oxide, mica, boron nitride, aluminum fluoride and the like.

In the vacuum switchgear of the above construction, when a high electric field is applied, the electric field tends to concentrates on corners, bent portions, protruding portions and ends of the disk-shaped portion 61*a* of the conductor 61, the disk-shaped portion 62*a* of the main circuit conductor 62, the flexible conductors 63, 64, the main circuit switching unit 10 and the isolator 20. Particulate foreign matters of a few micron meters may be produced in the manufacturing process or during open-close operations. These particulate foreign matters, if left as are, may lead to a dielectric breakdown. Equipment is basically designed and manufactured in a manner that prevents formation of such particulate foreign matters. However, if the particulate foreign matters formed nevertheless can be made harmless, the manufacturing process can be simplified and the equipment reliability improved.

In this embodiment, therefore, shields 101, 103, 105, 107 and 109 that shield a part or all of areas where particulate foreign matters are produced during the operation of the main circuit switching unit 10 and the isolator 20, such as electric field concentrated regions, are arranged inside the vacuum containers 1, 2. The respective shields 101, 103, 105, 107 and 109 are insulated from the vacuum containers 1, 2. That is, the shields 101, 103, 105, 107 and 109 are secured to the vacuum containers 1, 2 through spacers 100, 102, 104, 106, 108 made of insulating material. The shields 101, 107 are formed cylindrical and the shields 103, 105, 109 are formed like a plate. The shields 101, 103, 105, 107, 109 have their ends bent inward to reduce electric field concentration. The shield 101 is constructed to shield particulate foreign matters produced by the conductor 61, the disk-shaped portion 61*a* and the flexible conductor 63. The shield 107 is constructed to shield particulate foreign matters coming from the main circuit conductor 62 and the disk-shaped portion 62*a*. The shield 103 is designed to shield particulate foreign matters coming from a connecting portion between the flexible conductor 63 and the movable electrode 11. The shield 105 is designed to shield particulate foreign matters coming from the isolator 20. The shield 109 is designed to shield particulate foreign matters coming from the flexible conductor 64 and the main circuit conductor 62.

With the above construction, if a dielectric breakdown phenomenon occurs in the electric field concentrated regions due to the formation of particulate foreign matters, in that instant, an electricity flows between the field concentrated regions and the shields 101, 103, 105, 107, 109 through the particulate foreign matters, and they have the same potential, for example, an operational voltage of 2 kV. However, since the shields 101, 103, 105, 107, 109 are insulated from the vacuum containers 1, 2, at the moment when the shields 101, 103, 105, 107, 109 and the electric field concentrated regions are brought to the same potential, an electric field between the conductors of the field concentrated regions and the shields 101, 103, 105, 107, 109 disappears and charged particles produced by the dielectric breakdown phenomenon are no longer accelerated by the field, making it impossible for the dielectric breakdown phenomenon to persist. Then, once the dielectric breakdown phenomenon disappears, the particulate foreign matters which triggered the dielectric breakdown phenomenon disappear with it. Further, since the dielectric strength of the devices when there are no particulate foreign matter is more than several times the service voltage, the dielectric strength is instantly restored, protecting the devices against damages. By setting the dielectric strength between the shields 101, 103, 105, 107, 109 and the vacuum containers 1, 2 strong enough to withstand the service voltage, it is also possible to avoid a ground fault and prevent a dielectric breakdown phenomenon from causing a possible failure of the power system.

Figure 2:
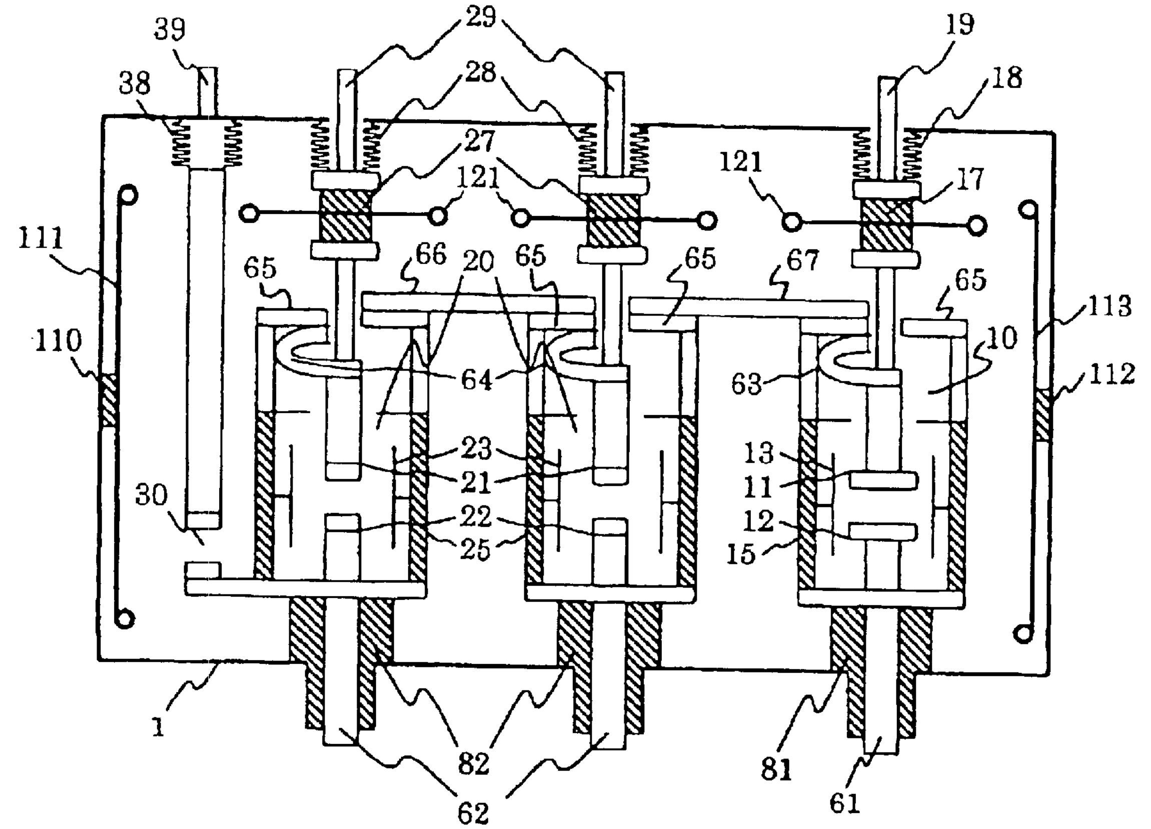
FIG. 2 is a vertical sectional view of a vacuum switchgear showing the second embodiment of the invention.
Figure 3:
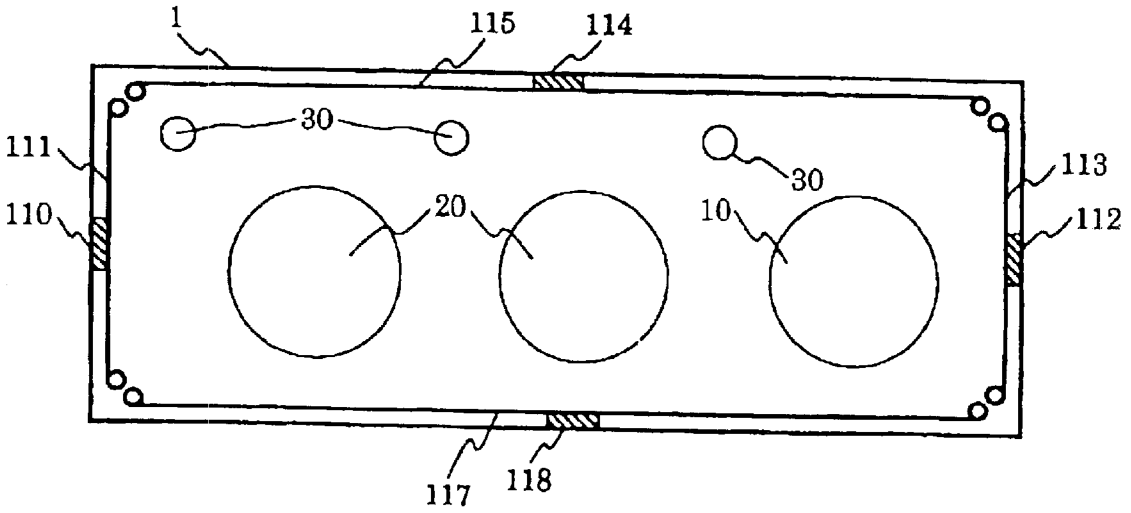
FIG. 3 is a plan view of the vacuum switchgear shown in FIG. 2.

Next, a second embodiment of the invention will be described with reference to FIG. 2 and FIG. 3. In this embodiment two isolators 20 are received in the vacuum container 1 in addition to the main circuit switching unit 10, with each isolator 20 electrically connected to the main circuit switching unit 10. The main circuit switching unit 10 and the isolators 20 are each provided with an earthing device 30 so that they can be earthed independently of each other. The movable electrode 21 of each isolator 20 is connected through the flexible conductor 64 to the conductor 65, which in turn is connected to the conductor 66. The movable electrode 11 of the main circuit switching unit 10 is connected through the flexible conductor 63 to the conductor 65. The conductor 65 of the main circuit switching unit 10 is connected through a conductor 67 to the conductor 65 of the adjoining isolator 20.

In this embodiment, shields 111, 113, 115, 117, 121 made of a metal plate are arranged inside the vacuum container 1 to enclose the main circuit switching unit 10, the isolators 20 and the earthing devices 30 by taking areas surrounding the main circuit switching unit 10 and the isolators 20 as particulate foreign matter generation areas. The respective shields 111, 113, 115, 117 are secured to the vacuum container 1 through spacers 110, 112, 114, 118 as insulating members, and the insulating plates 121 are secured to the vacuum container 1 through insulating rods 17, 27. The shields 111, 113, 115, 117, 121 each shaped like a plate have their opposite ends bent inward in a large radius to allow reduction of electric field concentration. Covering the ends of the shields with an insulating material can further enhance the dielectric strength. Covering of the ends with the insulating material may be carried out by covering them with a ceramic sheet or by forming a diamond-shaped carbon thin film.

In this embodiment, since the shields 111, 113, 115, 117, 121 insulated from the vacuum container 1 are arranged inside the vacuum container 1, if a dielectric breakdown phenomenon due to particulate foreign matters occurs at electric field concentrated regions on the main circuit switching unit 10, the isolators 20 and the earthing devices 30, it is possible to prevent the dielectric breakdown phenomenon from damaging the devices and to avoid a ground fault. This in turn prevents the dielectric breakdown phenomenon from causing a possible failure of the power system.

Further, in this embodiment, the connecting portions 81, 82, the conductor 61 and the main circuit conductor 62 are arranged in the same direction, and the operation rods 19, 29, 39 are also arranged in the same direction as those of the conductor 61 and the main circuit conductor 62. The switchgear therefore can be constructed in a simple configuration with its sides almost planar, and the shields 111, 113, 115 and 117 can also be in simple shapes. This makes the installation easy.

Further, the disk-shaped shields 121 are arranged around the insulating rods 17, 27. Therefore, if a dielectric breakdown phenomenon occurs in an upper space of the vacuum container 1 due to particulate foreign matters coming from an upper side of the main circuit switching unit 10 and the isolators 20, this dielectric breakdown phenomenon can be instantly eliminated by the shields 121.

Further, also installing shields below the main circuit switching unit 10 and the isolators 20 through insulating spacers can prevent particulate foreign matters lying on the bottom of the container from floating up.

Although in each of the above embodiments, the shields have been described as being formed of metal plates, they may be formed of an insulating material such as ceramics. If the shields are made of ceramics, when a dielectric breakdown phenomenon occurs, the surfaces of the shields become the same electrical potential with that of the conductors. The ceramics material may be alumina, silica, magnesium oxide, titanium oxide, mica, boron nitride and aluminum fluoride.

Following a dielectric breakdown phenomenon occurring between the shields and the conductors, there is a case where a peak potential of AC service voltage remains on the shields. In this case, a dielectric strength for withstanding the DC voltage is required. If insulation distances corresponding to the required dielectric strength are provided, there is no problem. Alternatively, the DC voltage can be prevented from acting on the shields by providing the surface of the insulating material with a highly resistive conductive layer that does not affect the insulation against an AC voltage and by dissipating charges accumulated on the shields. This can reduce the insulation distances and allows the devices to be made compact. For example, a highly resistive conductive layer may be formed over the surfaces of the shields made of a metal plate to connect the metal plate and the vacuum container. Here, the resistance of the conductive layer has to be more than $10^{10}\ \Omega$.

Although the shields have been described as each being arranged between the conductor and the vacuum container, a plurality of shields may be stacked together and installed to reduce a voltage applied to each of the shields, thus enhancing the insulation reliability. In this case, a spacer as an insulating material is inserted between the shields.

In installing the switching units such as the main circuit switching unit 10 and the isolator 20 in the vacuum containers 1, 2, the same number of switching units, each having a stationary electrode and a movable electrode, as that of phases, e.g. three units for three phases, may be installed. In that case, used is such a construction that the stationary electrode and the movable electrode of each phase are connected to a bus side conductor and a load side conductor of the corresponding phase or vice versa through wiring conductors of the associated phase in the containers, e.g. flexible conductors. Shields are installed inside, and insulated from, the vacuum containers to shield a part or all of areas where particulate foreign matters are produced by the open-close operation of the switching unit of each phase.

It should be further understood that although the foregoing description has been made on the embodiments of the invention, the invention is not limited solely to the specific forms and various changes and modifications may be made without departing from the spirit of the invention and the scope of the appended claims.

What is claimed is:

1. A vacuum switchgear comprising:

a vacuum container required to be earthed;

a switching unit accommodated in said vacuum container and having a stationary electrode and a movable electrode;

a bus side conductor and a load side conductor arranged to extend in and out of said vacuum container;

wiring conductors arranged in said container, connecting said stationary electrode to one of said bus side conductor and said load side conductor and connecting said movable electrode to the other of said bus side conductor and said load side conductor; and a shield arranged inside said vacuum container to shield a part or all of an area where particulate foreign matters are produced by an open-close operation of said switching unit, said shield being insulated from and secured to said vacuum container.

2. A vacuum switchgear according to claim 1, wherein said shield is formed of a metal plate and secured to said vacuum container through an insulating member.

3. A vacuum switchgear according to claim 1, wherein said shield is formed of an insulating material containing ceramics and secured to said vacuum container through an insulating member.

4. A vacuum switchgear according to claim 1, wherein said shield is formed of a plate-shaped insulating material and secured to said vacuum container through an insulating member.

5. A vacuum switchgear according to claim 1, wherein said shield is formed of a metal plate and secured to said vacuum container through an insulating member, and said metal plate is partly or wholly covered with an insulating coating.

6. A vacuum switchgear according to claim 1, wherein a distance between said shield and said vacuum container is set to be able to withstand a service voltage of a power system connected to said bus side conductor.

7. A vacuum switchgear according to claim 1, wherein said shield is arranged to face electric field concentrated regions of said switching unit, said bus-side conductor, said load side conductor and said wiring conductors in said container.

8. A vacuum switchgear according to claim 1, wherein said shield is arranged in a lower part of said vacuum container to face electric field concentrated regions of said switching unit, said bus-side conductor, said load side conductor and said wiring conductors in said container.

9. A vacuum switchgear according to claim 1, wherein said shield is formed of a metal plate and secured to said vacuum container through an insulating member, and said insulating member has its surface formed with a highly resistive conducting layer connecting said metal plate and said vacuum container.

10. A vacuum switchgear according to claim 1, wherein said shield comprises a plurality of shield plates and an insulating member is interposed between adjacent shield plates.

11. A vacuum switchgear comprising:

a vacuum container required to be earthed;

switching units of the same number as that of phases to be dealt with by the switchgear, said switching units being accommodated in said vacuum container and each having a stationary electrode and a movable electrode;

bus side conductors and load side conductors of the same number as that of the phases, said bus side conductors and said load side conductors being arranged to extend in and out of said vacuum container;

wiring conductors for each phase arranged in said container, connecting the stationary electrode of each phase to one of the bus side conductor and the load side conductor of the same phase and connecting the movable electrode of the same phase to the other of the bus side conductor and the load side conductor of the same phase; and shields arranged inside said vacuum container to shield a part or all of areas where particulate foreign matters are produced by an open-close operation of said switching unit of each phase, said shields being insulated from and secured to said vacuum container.

12. A vacuum switchgear comprising:

a vacuum container required to be earthed;

one or more switching units accommodated in said vacuum container and each having a stationary electrode and a movable electrode;

a bus side conductor and a load side conductor arranged to extend in and out of said vacuum container;

wiring conductors arranged in said container, connecting the stationary electrode to one of the bus side conductor and the load side conductor and connecting the movable electrode to the other of the bus side conductor and the load side conductor;

an intermediate shield arranged around said switching units to shield arcs produced by an open-close operation of said switching units; and a shield arranged inside said vacuum container to shield a part or all of areas where particulate foreign matters are produced by an open-close operation of said switching units, said shield being insulated from and secured to said vacuum container.

* * * * *